United States Patent
Hara

(10) Patent No.: US 8,537,331 B2
(45) Date of Patent: *Sep. 17, 2013

(54) EXPOSURE APPARATUS AND METHOD FOR MANUFACTURING DEVICE

(75) Inventor: Hideaki Hara, Kumagaya (JP)

(73) Assignee: Nikon Corporation, Tokyo (JP)

( * ) Notice: Subject to any disclaimer, the term of this patent is extended or adjusted under 35 U.S.C. 154(b) by 816 days.

This patent is subject to a terminal disclaimer.

(21) Appl. No.: 12/219,835

(22) Filed: Jul. 29, 2008

(65) Prior Publication Data

US 2008/0291410 A1 Nov. 27, 2008

Related U.S. Application Data

(60) Division of application No. 11/239,402, filed on Sep. 30, 2005, now Pat. No. 7,480,029, which is a continuation of application No. PCT/JP2004/004969, filed on Apr. 6, 2004.

(30) Foreign Application Priority Data

Apr. 7, 2003 (JP) .................................. 2003-103145

(51) Int. Cl.
*G03B 27/42* (2006.01)
*G03B 27/52* (2006.01)

(52) U.S. Cl.
USPC ............................................. 355/53; 355/30

(58) Field of Classification Search
USPC .............. 355/30, 53, 55, 67, 71, 73; 250/548
See application file for complete search history.

(56) References Cited

U.S. PATENT DOCUMENTS

| 3,243,321 | A | 3/1966 | Rowand |
| 3,648,587 | A | 3/1972 | Stevens |
| 4,346,164 | A | 8/1982 | Tabarelli et al. |
| 4,480,910 | A | 11/1984 | Takanashi et al. |
| 5,059,287 | A | 10/1991 | Harkey, Sr. |
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |
| 5,874,820 | A | 2/1999 | Lee |
| 6,757,051 | B2 | 6/2004 | Takahashi et al. |
| 6,788,477 | B2 | 9/2004 | Lin |

(Continued)

FOREIGN PATENT DOCUMENTS

| DE | 221 563 A1 | 4/1985 |
| DE | 224 448 A1 | 7/1985 |

(Continued)

OTHER PUBLICATIONS

Mar. 18, 2008 Office Action in U.S. Appl. No. 11/187,010.

(Continued)

*Primary Examiner* — Hung Henry Nguyen
(74) *Attorney, Agent, or Firm* — Oliff & Berridge, PLC

(57) ABSTRACT

An immersion exposure apparatus includes an optical member, a supply outlet that supplies a liquid to a space between an upper surface of the optical member and a movable object, and an annular member at least a portion of which is arranged around the optical member, the space between the upper surface of the optical member and the object being filled with the liquid.

50 Claims, 8 Drawing Sheets

(56) References Cited

U.S. PATENT DOCUMENTS

| | | | |
|---|---|---|---|
| 6,809,794 B1 | 10/2004 | Sewell | |
| 6,980,277 B2 | 12/2005 | Sewell | |
| 7,021,119 B2* | 4/2006 | Violette | 73/37.5 |
| 7,367,345 B1 | 5/2008 | Hemker et al. | |
| 7,480,029 B2* | 1/2009 | Hara | 355/53 |
| 2002/0145714 A1 | 10/2002 | Hirayanagi | |
| 2002/0149753 A1 | 10/2002 | Hase | |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1* | 4/2004 | Lin | 359/380 |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Maria Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Maria Zaal et al. | |
| 2005/0225737 A1 | 10/2005 | Weissenrieder et al. | |
| 2005/0254031 A1 | 11/2005 | Sewell | |
| 2005/0270505 A1 | 12/2005 | Smith | |
| 2007/0285637 A1 | 12/2007 | Dorsel et al. | |

FOREIGN PATENT DOCUMENTS

| | | |
|---|---|---|
| EP | 0 418 427 A2 | 3/1991 |
| EP | 0 605 103 A1 | 7/1994 |
| JP | A-57-153433 | 9/1982 |
| JP | A-58-202448 | 11/1983 |
| JP | A-59-019912 | 2/1984 |
| JP | A-62-065326 | 3/1987 |
| JP | A-63-157419 | 6/1988 |
| JP | A-04-305915 | 10/1992 |
| JP | A-04-305917 | 10/1992 |
| JP | A-05-060981 | 3/1993 |
| JP | A-05-062877 | 3/1993 |
| JP | A-6-124873 | 5/1994 |
| JP | A-06-208058 | 7/1994 |
| JP | A-07-220990 | 8/1995 |
| JP | A 08-166475 | 6/1996 |
| JP | A-8-316125 | 11/1996 |
| JP | A 08-330224 | 12/1996 |
| JP | A 10-163099 | 6/1998 |
| JP | A 10-214783 | 8/1998 |
| JP | A-10-303114 | 11/1998 |
| JP | A-10-340846 | 12/1998 |
| JP | A-11-176727 | 7/1999 |
| JP | 2000-012453 | * 1/2000 |
| JP | A-2000-012453 | 1/2000 |
| JP | A-2000-058436 | 2/2000 |
| JP | A 2000-505958 | 5/2000 |
| SG | 110100 | 4/2005 |
| WO | WO 98/28665 A1 | 7/1998 |
| WO | WO99/49504 A1 | 9/1999 |
| WO | WO 02/091078 A1 | 11/2002 |
| WO | WO 03/077037 A1 | 9/2003 |
| WO | WO2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |

| | | | |
|---|---|---|---|
| WO | WO 2005/071491 A2 | 8/2005 | |
| WO | WO 2005/074606 A2 | 8/2005 | |
| WO | WO 2005/076084 A1 | 8/2005 | |
| WO | WO 2005/081030 A1 | 9/2005 | |
| WO | WO 2005/081067 A1 | 9/2005 | |
| WO | WO 2005/081068 A2 | 9/2005 | |

OTHER PUBLICATIONS

Sep. 8, 2008 Office Action in U.S. Appl. No. 11/187,010.
Dec. 30, 2008 Office Action in U.S. Appl. No. 11/187,010.
Jul. 21, 2009 Office Action in U.S. Appl. No. 11/187,010.
Feb. 25, 2010 Office Action in U.S. Appl. No. 11/187,010.
Dec. 10, 2007 European Search Report in European Application No. 04726018.7.
Mar. 13, 2008 Office Action in European Application No. 04726018.7.
Dec. 30, 2009 Office Action (Notice of Opposition) in European Application No. 04726018.7, with translation.
Mar. 3, 2006 Australian Notice of Allowance in Singapore Application No. 200506373-0.
Jul. 6, 2009 Australian Office Action in Singapore Application No. 200708903-0.
Jul. 27, 2004 International Search report in Application No. PCT/JP2004/004969, with translation.
Jul. 27, 2004 Written Opinion in Application No. PCT/JP2004/004969, with translation.
Sep. 24, 2009 Office Action in Japanese Application No. 2005-505289, with translation.
Feb. 9, 2010 Office Action in Japanese Application No. 2005-505289, with translation.
Jun. 24, 2010 Office Action in U.S. Appl. No. 11/600,763.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, 3$^{rd}$ 157 nm symposium, Sep. 4, 2002, "Nikon F2 Exposure Tool", Soichi Owa et al., 25 pages (slides 1-25).
Nikon Corporation, Immersion Lithography Workshop, Dec. 11, 2002, 24 pages (slides 1-24).
Optical Microlithography XVI, Proceedings of SPIE vol. 5040 (2003), "Immersion lithography; its potential performance and issues", Soichi Owa et al., pp. 724-733.
Nikon Corporation, Immersion Workshop, Jan. 27, 2004, "Update on 193 nm immersion exposure tool", S. Owa et al., 38 pages (slides 1-38).
Nikon Corporation, Litho Forum, Jan. 28, 2004, "Update on 193 nm immersion exposure tool", S. Owa et al., 51 pages (slides 1-51).
Nikon Corporation, NGL Workshop, Jul. 10, 2003, :Potential performance and feasibility of immersion lithography, Soichi Owa et al., 33 pages, slides 1-33.
May 19, 2010 Australian Search and Examination Report in Singapore Application No. 200708903-0.
Feb. 21, 2006 Office Action in U.S. Appl. No. 11/239,402.
Nov. 29, 2006 Office Action in U.S. Appl. No. 11/239,402.
Jul. 19, 2007 Office Action in U.S. Appl. No. 11/239,402.
Jan. 25, 2008 Office Action in U.S. Appl. No. 11/239,402.
Sep. 15, 2008 Notice of Allowance in U.S. Appl. No. 11/239,402.
Mar. 13, 2006 Office Action in U.S. Appl. No. 11/257,089.
Jan. 26, 2007 Office Action in U.S. Appl. No. 11/257,089.
Jul. 2, 2007 Office Action in U.S. Appl. No. 11/257,089.
Sep. 26, 2008 Office Action in U.S. Appl. No. 11/600,763.
Jun. 15, 2009 Office Action in U.S. Appl. No. 11/600,763.
Nov. 3, 2009 Office Action in U.S. Appl. No. 11/600,763.
Jun. 22, 2011 Notice of Allowance in U.S. Appl. No. 11/600,763.
Feb. 10, 2011 Notice of Allowance in U.S. Appl. No. 11/600,763.
Mar. 22, 2011 Office Action in Japanese Application No. 2005-505289, with translation.
Jan. 28, 2011 Office Action issued in Korean Patent Application No. 10-2005-7019039 (w/English-language Translation).
Sep. 22, 2011 Office Action issued in EP Application No. 04726018.7.
Oct. 4, 2011 Office Action issued in JP Application No. 2005-505289 (with English translation).
Oct. 13, 2011 Notice of Allowance issued in U.S. Appl. No. 11/600,763.
Oct. 14, 2010 Office Action issued in TW Application No. 093109567 (with English translation).
Jul. 25, 2011 Office Action issued in TW Application No. 093109567 (with English translation).
Jul. 24, 2012 Office Action issued in JP Application No. 2010-108612 (with English translation).

* cited by examiner

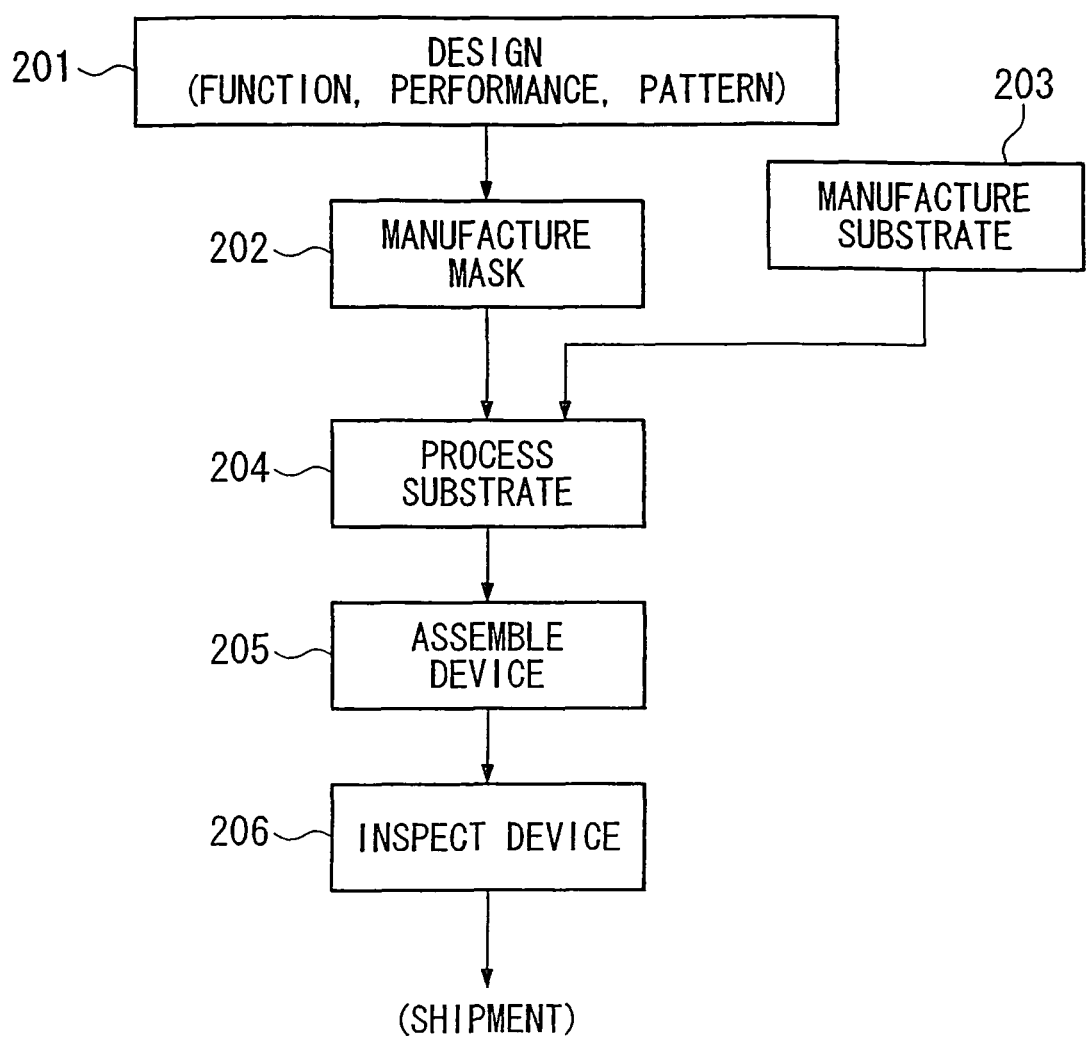

EXPOSURE APPARATUS AND METHOD FOR MANUFACTURING DEVICE

CROSS-REFERENCE TO RELATED APPLICATION

This is a Division of application Ser. No. 11/239,402 filed Sep. 30, 2005 (now U.S. Pat. No. 7,480,029), which is a Continuation of International Application No. PCT/JP2004/004969 filed Apr. 6, 2004, which claims priority to Japanese Patent Application No. 2003-103145, filed Apr. 7, 2003. The content of each of the aforementioned applications is incorporated herein by reference in its entirety.

BACKGROUND OF THE INVENTION

1. Field of the Invention

The present invention relates to an exposure apparatus and a device manufacturing method in which an image of a pattern is projection-exposed onto a substrate via a projection optical system and, in particular, to a liquid immersion type exposure apparatus.

2. Description of Related Art

Semiconductor devices and liquid crystal display devices are manufactured through the so-called photolithography technique, by which a pattern formed on a mask is transferred onto a photosensitive substrate. The exposure apparatus used in the photolithography process has a mask stage that supports a mask and a substrate stage that supports a substrate, and transfers the mask pattern, via a projection optical system, onto the substrate while successively moving the mask stage and the substrate stage. In recent years, there has been demand for higher resolution projection optical systems in order to handle the much higher levels of integration of device patterns. As the exposure wavelength to be used is shorter, the resolution of the projection optical system becomes higher. As the numerical aperture of the projection optical system is larger, the resolution of the projection optical system becomes higher. Consequently, the exposure wavelength used in exposure apparatuses has shortened year by year, and the numerical aperture of projection optical systems has also increased. Furthermore, the currently mainstream exposure wavelength is the 248 nm KrF excimer laser, but an even shorter wavelength 193 nm ArF excimer laser is also being commercialized. In addition, as well as resolution, the depth of focus (DOF) is also important when performing an exposure. The resolution R and the depth of focus δ are respectively expressed by the following formulas:

$$R = k_1 \cdot \lambda / NA, \quad (1)$$

$$\delta = \pm k_2 \cdot \lambda / NA^2, \quad (2)$$

where $\lambda$ is the exposure wavelength, NA is the numerical aperture of the projection optical system, and $k_1$ and $k_2$ are process coefficients. It can be seen from formulas (1) and (2) that if, to enhance the resolution R, the wavelength $\lambda$ is made shorter and the numerical aperture is made larger, then the depth of focus δ becomes narrower.

When the depth of focus δ becomes too narrow, it becomes difficult to make the substrate surface coincide with the image plane of the projection optical system, and thus there occurs the possibility that the focus margin during the exposure operation will be insufficient. Accordingly, the liquid immersion method has been proposed, as disclosed in, for example, Japanese Unexamined Patent Application, First Publication No. H10-303114, as a method to substantially shorten the exposure wavelength and increase the depth of focus. This liquid immersion method is designed to, by filling the space between the under surface of the projection optical system and the substrate surface with a liquid, e.g., water or organic solvent, form a liquid immersion region and thus by taking advantage of the fact that the wavelength of the exposure light in the liquid becomes 1/n times (n is the refractive index of the liquid and is generally about 1.2 to 1.6) of that in the air, improve the resolution and, at the same time, enlarge the depth of focus by approximately n times.

By the way, with the above-mentioned related art, there are problems as described below.

The immersion liquid type exposure apparatus disclosed in the above-mentioned Japanese Unexamined Patent Application, First Publication No. H10-303114, is configured such that a liquid bath is formed of a holder table, wall portions, etc. on a substrate stage, and a substrate is positioned in the liquid bath. In the case of such a configuration, when the substrate stage is moved, there arises not only the possibility that the liquid surface undulates and the liquid scatters, but also the possibility that the pattern image projected onto the substrate deteriorates due to the undulation of the liquid. In addition, pipings for supplying and recovering the liquid need to be connected to the substrate stage, which may adversely affect the movement accuracy of the stage.

SUMMARY OF THE INVENTION

The present invention has been made in consideration of such situations, and its objective is to provide an exposure apparatus and a device manufacturing method in which scattering of the liquid for forming a liquid immersion region is suppressed, the movement of the substrate stage is not obstructed by pipings and the like for supplying and recovering the liquid, and a substrate can be exposed with a required pattern accuracy.

To resolve the above-described problems, the present invention adopts the following configuration corresponding to FIGS. 1 to 8 as illustrated in embodiments.

An exposure apparatus of the present invention is an exposure apparatus wherein an image of a pattern is projected onto a substrate via a projection optical system to expose the substrate, the exposure apparatus includes a substrate moving means that is movable while holding the substrate above the projection optical system and a liquid immersion unit that fills at least a portion of the space between the projection optical system, wherein the substrate with a liquid and projects the image of a pattern onto the substrate via the projection optical system and the liquid.

Further, a device manufacturing method of the present invention uses the above-described exposure apparatus.

In accordance with the present invention, since the substrate moving device that is movable while holding the substrate is provided above the projection optical system, a liquid immersion region can be formed between the projection optical system and the substrate, with the liquid being held on the upper end portion of the projection optical system fixed at a predetermined position. That is, since it is configured such that the substrate moves relative to the liquid, scattering of the liquid can be suppressed, and deterioration of the pattern image projected onto the substrate can be prevented. In addition, since pipings and the like for supplying and recovering the liquid for forming the liquid immersion region on the upper end portion of the fixed projection optical system need not be connected to the substrate moving device (substrate stage), deterioration of the movement accuracy of the substrate stage due to the pipings and the like does not occur.

BRIEF DESCRIPTION OF THE DRAWINGS

FIG. 8 is a flowchart showing an example of a semiconductor device manufacturing process.

DETAILED DESCRIPTION OF THE INVENTION

Figure 1:
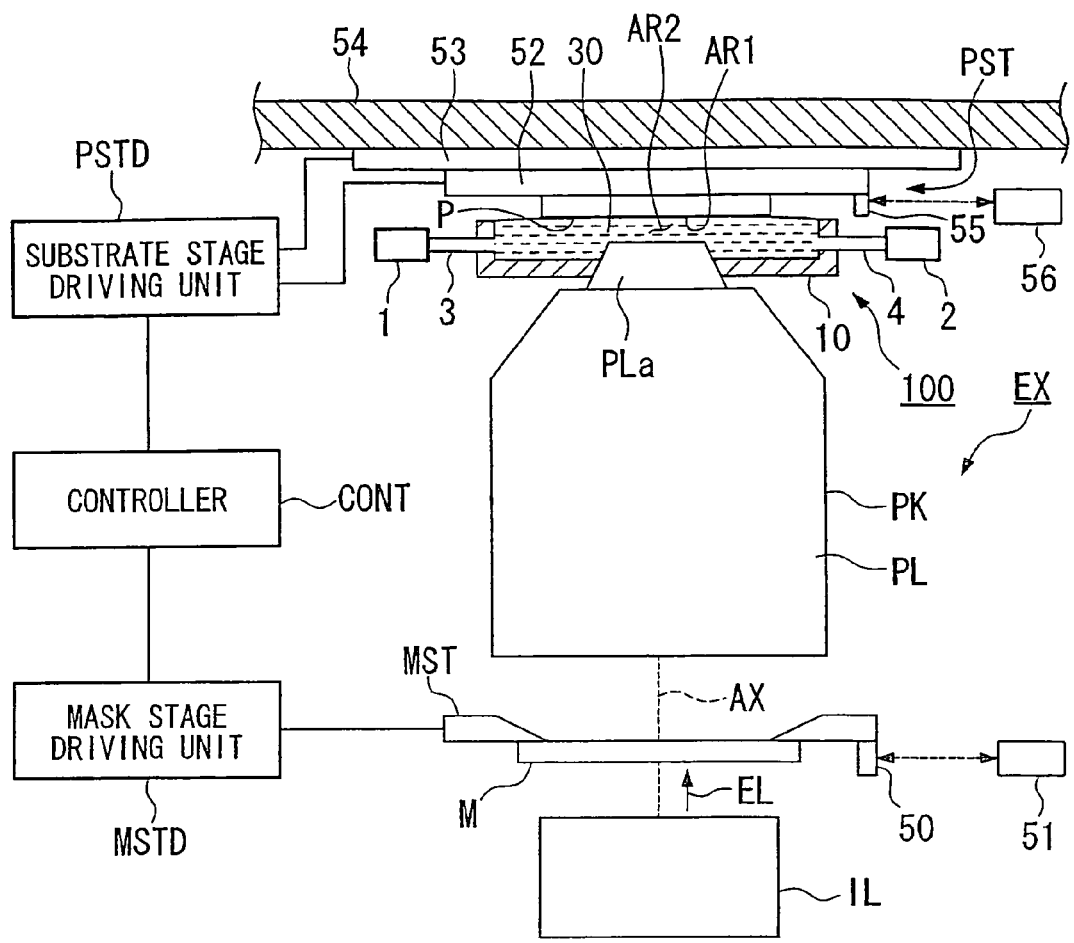
FIG. 1 is an outline configuration drawing showing a first embodiment of an exposure apparatus of the present invention.

Now, referring to the drawings, an exposure apparatus of the present invention will be described. FIG. 1 is an outline configuration drawing showing a first embodiment of an exposure apparatus of the present invention.

Referring to FIG. 1, an exposure apparatus EX is provided with a mask stage MST that holds a mask M, a substrate stage PST that holds a substrate P, an illumination optical system IL that illuminates the mask M held by the mask stage MST with exposure light EL, a projection optical system PL that projects a pattern image of the mask M illuminated with the exposure light EL onto the substrate P held by the substrate stage PST, and a controller CONT that controls the overall operation of the exposure apparatus EX. The projection optical system PL is configured to form an image plane thereabove. The mask stage MST that holds the mask M is disposed under the projection optical system PL, and on the other hand, the substrate stage PST that holds the substrate P is disposed above the projection optical system PL.

The exposure apparatus EX of the embodiment is a liquid immersion type exposure apparatus to which a liquid immersion method is applied, with the exposure wavelength being shortened in effect, to improve the resolution and at the same time to widen the depth of focus and is provided with a liquid immersion unit 100 constituting a part of a liquid immersion device that fills at least a portion of the space between the projection optical system PL and the substrate P. The liquid immersion unit 100 is provided with a liquid bath 10 that is fixed to the upper end portion on the image plane side of projection optical system PL, a liquid supply device 1 that supplies liquid 30 via a supply pipe 3 forming a flow path to the liquid bath 10, and a liquid recovery device 2 that recovers the liquid via a recovery pipe 4 forming a flow path of the liquid from the liquid bath 10. And, in the exposure apparatus EX, at least while transferring the pattern image of the mask M onto the substrate P, at least a portion of the space between the projection optical system PL and the substrate P is filled with the liquid 30 supplied from the liquid supply device 1 of the liquid immersion unit 100 and a liquid immersion region AR2 is formed so as to include the projection area AR1 of the projection optical system PL. Specifically, in the exposure apparatus EX, the space between the optical element PLa located at the upper end portion of the projection optical system PL and the exposure surface (top surface) of the substrate P is filled with the liquid 30, and the pattern image of the mask M is projected onto the substrate P via the projection optical system PL and the liquid 30 between the projection optical system PL and the substrate P, and thus the substrate P is exposed.

The embodiment will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) along the scanning direction. In the following description, it is assumed that the direction that coincides with the optical axis AX of the projection optical system PL is referred to as the Z-axis direction, that the synchronous movement direction (the scanning direction), in a plane perpendicular to the Z-axis direction, of the mask M and the substrate P is referred to as the X-axis direction, and that the direction perpendicular to the Z-direction and to the Y-direction is referred to as the Y-direction (the non-scanning direction). Further, it is assumed that the direction around the X-axis, the direction around the Y-axis, and the direction around the Z-axis are respectively referred to as the θX-direction, the θY-direction, and the θZ-direction. It should be noted that the "substrate" referred to herein includes a semiconductor wafer over which a photoresist, a photosensitive material, is coated and that the "mask" includes a reticle formed with a device pattern to be reduction projected onto a substrate.

The illumination optical system IL is for illuminating the mask M held by the mask stage MST with the exposure light EL and comprises an exposure light source, an optical integrator for uniforming the illuminance of a light flux emitted from the exposure light source, a condenser lens for condensing the exposure light EL from the optical integrator, a relay lens system, a variable field stop for setting an illumination area on the mask M formed by the exposure light EL to be of a slit-like shape, etc. A predetermined illumination area on the mask M is illuminated, by the illumination optical system IL, with the exposure light EL having a uniform illuminance distribution. As the exposure light EL emitted from the illumination optical system IL, for example, a bright line of ultraviolet region (g-line, h-line, i-line) emitted from a mercury lamp, a deep ultraviolet light (DUV light) such as a KrF excimer laser light (wavelength of 248 nm), and a vacuum ultraviolet light (VUV light) such as an ArF excimer laser light (wavelength of 193 nm) or an $F_2$ laser light (wavelength of 157 nm) may be used. In the embodiment, an ArF excimer laser light is used.

The mask stage MST is for supporting the mask M, is disposed under the projection optical system PL, and is two-dimensionally movable and finely rotatable in the θZ-direction, in a plane perpendicular to the optical axis AX, i.e., in the XY-plane. In the mask stage MST are provided vacuum suction holes for vacuum sucking mask M. The mask M is sucked by and held on the mask stage MST via the vacuum suction holes so that the pattern surface of the mask M is directed upwardly (in the +Z direction). Further, the mask MST is driven by mask stage driving unit MSTD such as a linear motor. The mask stage driving unit MSTD is controlled by the controller CONT. The mask stage MST is provided with a moving mirror 50. Further, a laser interferometer 51 is positioned at a position facing the moving mirror 50. The two-dimensional position and the rotation angle of the mask M held by the mask stage MST are measured by the laser interferometer 51 in real time, and the measurement results are outputted to the controller CONT. By driving the mask stage driving unit MSTD based on the measurement results from the laser interferometer 51, the controller CONT performs positioning of the mask M held by the mask stage MST.

The projection optical system PL is for projection exposing the pattern of the mask M onto the substrate P at a predetermined projection magnification of β. The projection optical system PL is constituted by a plurality of optical elements, including an optical element (lens) PLa disposed at the substrate P side upper end portion, and those optical elements are supported by a lens barrel PK. And, the projection optical system PL is arranged such that it forms thereabove an image plane. In the embodiment, the projection optical system PL is a reduction system of which projection magnification β is, e.g., ¼ or ⅕. It should be noted that the projection optical system PL may also be either a 1× magnification system or a magnifying system. Also note that the optical element PLa at the upper end portion of the projection optical system PL of the embodiment is detachable (exchangeable) relative to the lens barrel PK, and the liquid 30 of the liquid immersion region AR2 is in contact with the optical element PLa. The liquid contact surface of the optical element PLa is a plane substantially parallel to the XY-plane.

The substrate stage PST constituting a part of a substrate moving device is movable while holding substrate P. The substrate stage PST is provided with a Z stage 52 that holds substrate P via a substrate holder, a XY stage 53 that supports the Z stage 52, and a base 54 that supports the XY stage 53. The base 54 is supported by a supporting member different from a supporting member that supports, e.g., the projection optical system PL. The substrate holder of the substrate stage PST holds the substrate P so that the substrate P's exposure surface that is coated with a photosensitive material and is to be exposed is directed downwardly (in the −Z direction). On the surface (under surface) of the substrate holder are provided a plurality of vacuum suction holes that communicate with a vacuum device. The substrate holder sucks and holds the substrate P via the vacuum suction holes. Further, the substrate stage PST is driven by the substrate stage driving unit PSTD such as a linear motor. The substrate stage driving unit PSTD is controlled by the controller CONT. By driving the Z stage 52, the Z-direction position (focus position) and the θX-direction and θY-direction positions of the substrate P held by the Z stage 52 are controlled. Further, by driving the XY stage 53, the XY-direction position (the position in the direction substantially parallel to the image plane of the projection optical system PL) of the substrate P is controlled. More specifically, the Z stage 52, by controlling the focus position and inclination angle of the substrate P, makes the surface of the substrate P to coincide with the image plane of the projection optical system PL in an auto-focus manner and an auto-leveling manner, the XY stage 53 performs positioning of the substrate P in the X-axis and Y-axis directions. It is to be noted that needless to say, the Z stage and the XY stage may be integrally constructed.

The substrate stage PST (Z stage 52) is provided with a moving mirror 55. Further, a laser interferometer 56 is positioned at a position facing the moving mirror 55. The two-dimensional position and the rotation angle of the substrate P held by the substrate stage PST are measured by the laser interferometer 56 in real time, and the measurement results are outputted to the controller CONT. By driving the substrate stage driving unit PSTD based on the measurement results from the laser interferometer 56, the controller CONT performs positioning of the substrate P held by the substrate stage PST.

Figure 2:
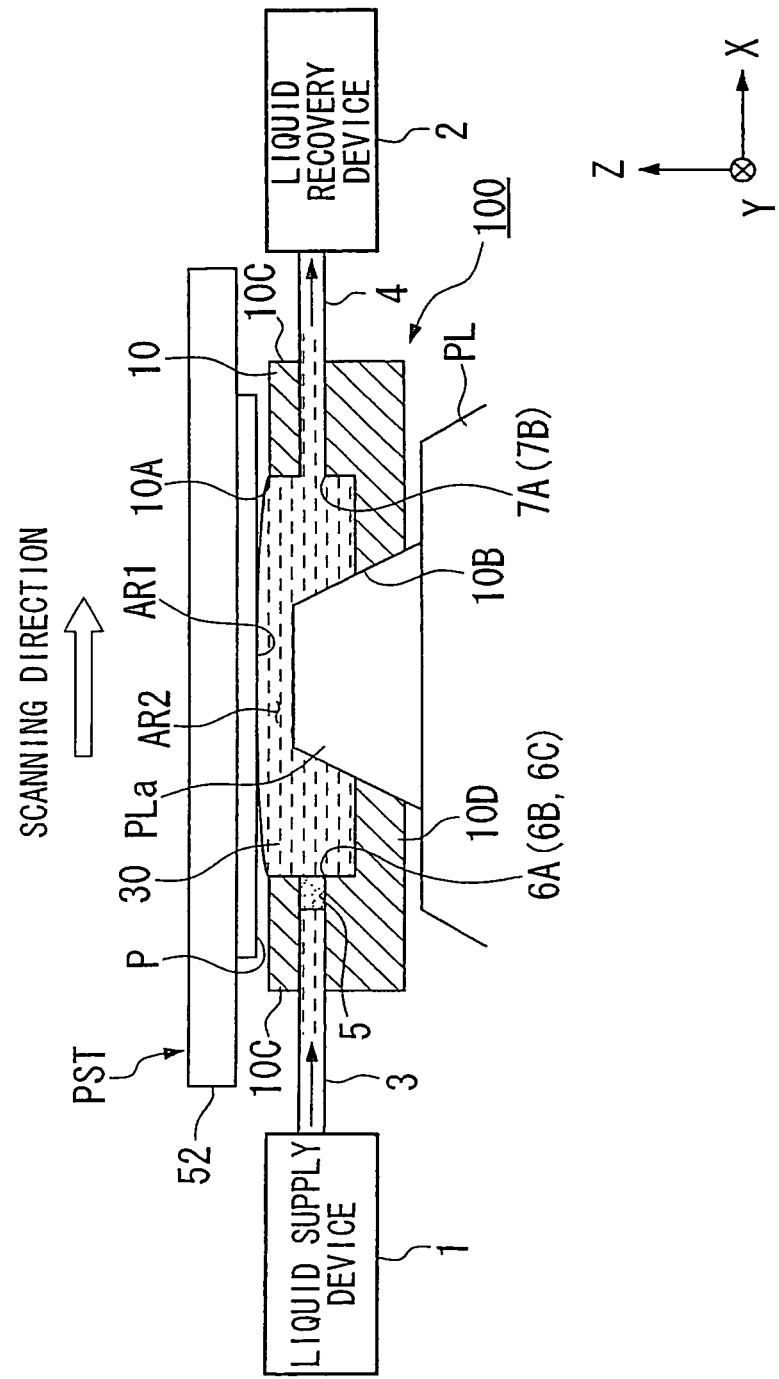
FIG. 2 is an enlarged drawing of a main part of FIG. 1 and is a sectional side view showing a liquid immersion unit and its vicinity.

FIG. 2 is an enlarged drawing of a main part of FIG. 1 and is a sectional side view showing the liquid immersion unit 100. In FIG. 2, the liquid immersion unit 100 is provided with the liquid bath 10 that has a side wall portion 10C and can hold the liquid 30, the liquid supply device 1 that supplies the liquid 30 to the liquid bath 10 via the supply pipe 3, and the liquid recovery device 2 that recovers the liquid 30 via the recovery pipe 4.

The liquid supply device 1 is provided with a tank that stores the liquid 30, a compressing pump, etc. and supplies the liquid 30 to the liquid bath 10 via the supply pipe 3. The liquid supply operation of the liquid supply device 1 is controlled by the controller CONT. The controller CONT can control the per-unit-time liquid supply amount to the liquid bath 10 of the liquid supply device 1. Further, the liquid supply device 1 is provided with a temperature adjusting device that adjusts the temperature of the liquid 30 to be supplied to the liquid bath 10. By using the temperature adjusting device, the liquid supply device 1 sets the temperature of the liquid 30 to be supplied to the liquid bath 10 to be, for example, substantially the same temperature as that inside a chamber in which the exposure apparatus EX is accommodated. Further, the supply pipe 3 is provided with a rectifying members 5 for rectifying the liquid 30 to be supplied to the liquid bath 10. The rectifying members 5 are constituted by, e.g., a porous material or a slit member having a slit-shaped flow path. Still further, the liquid supply device 1 may be provided with a gas bubble removal device (a degas unit) that removes gas bubbles contained in the liquid 30 to be supplied to the liquid bath 10. The gas bubble removal device can be constructed by, for example, a heating device that removes the gas bubbles by heating the liquid 30 or a decompressing unit in which the liquid 30 is stored in a predetermined a container and, by reducing the pressure inside the container, the gas bubbles are removed.

In the embodiment, purified water is used as the liquid 30. The purified water can transmit not only ArF excimer laser light, but also the exposure light EL even when it is, for example, a bright line of ultraviolet region (g-line, h-line, or i-line) emitted from a mercury lamp or deep ultraviolet light (DUV light) such as KrF excimer laser light (wavelength of 248 nm).

The liquid recovery device 2 is for recovering the liquid 30 in the liquid bath 1Q, is provided with, e.g., a suction device such as a vacuum pump, a tank that stores the recovered liquid 30, etc. The liquid recovery device 2 recovers the liquid 30 in the liquid bath 10 via the recovery pipe 4. The liquid recovery operation of the liquid recovery device 2 is controlled by the controller CONT, and the controller CONT can control the per-unit-time liquid recovery amount of the liquid recovery device 2.

The liquid bath 10 is for holding the liquid 30. The liquid bath 10 has the side wall portion 10c, and is attached to the upper end portion of the lens barrel of the projection optical system PL. On the top portion of the liquid bath 10 is formed an opening portion 10A, and the liquid 30 held by the liquid bath 10 is exposed toward the outside of the liquid bath 10 via the opening portion 10A. Here, the size of the opening portion 10A is formed to be larger than that of the projection area AR1 of the projection optical system PL. On the other hand, in a bottom portion 10D of the liquid bath 10 is formed a through-hole 10B. Into the through-hole 10B of the liquid bath 10 is fitted the lens barrel upper portion (not shown) of the projection optical system PL, and between the through-hole 10B and the lens barrel is provided a sealing member for preventing leakage of the liquid 30 in the liquid bath 10. Further, the upper end surface of the optical element PLa of the projection optical system PL is positioned to be lower than the upper end surface of the side wall portion 10c of the liquid bath 10; and thus, it is configured such that when the liquid bath 10 is filled with liquid 30, the upper end portion including the upper end surface of the optical element PLa is immersed in the liquid 30. Here, the liquid bath 10 is formed by, e.g., a ceramic material. Such a ceramic material, even if a part thereof elutes into the liquid 30, hardly affects the photosensitive material coated on the exposure surface of the substrate P.

The substrate stage PST is configured such that the exposure surface of the substrate P held by the stage is located apart from the upper end portion of the liquid bath 10 by a predetermined distance. More specifically, the distance between the substrate P and the liquid bath 10 is set such that the exposure surface of the substrate P and the liquid 30 exposed upwardly from the opening portion 10A of the liquid bath 10 come into contact with each other through the surface tension of the liquid 30.

Figure 3:
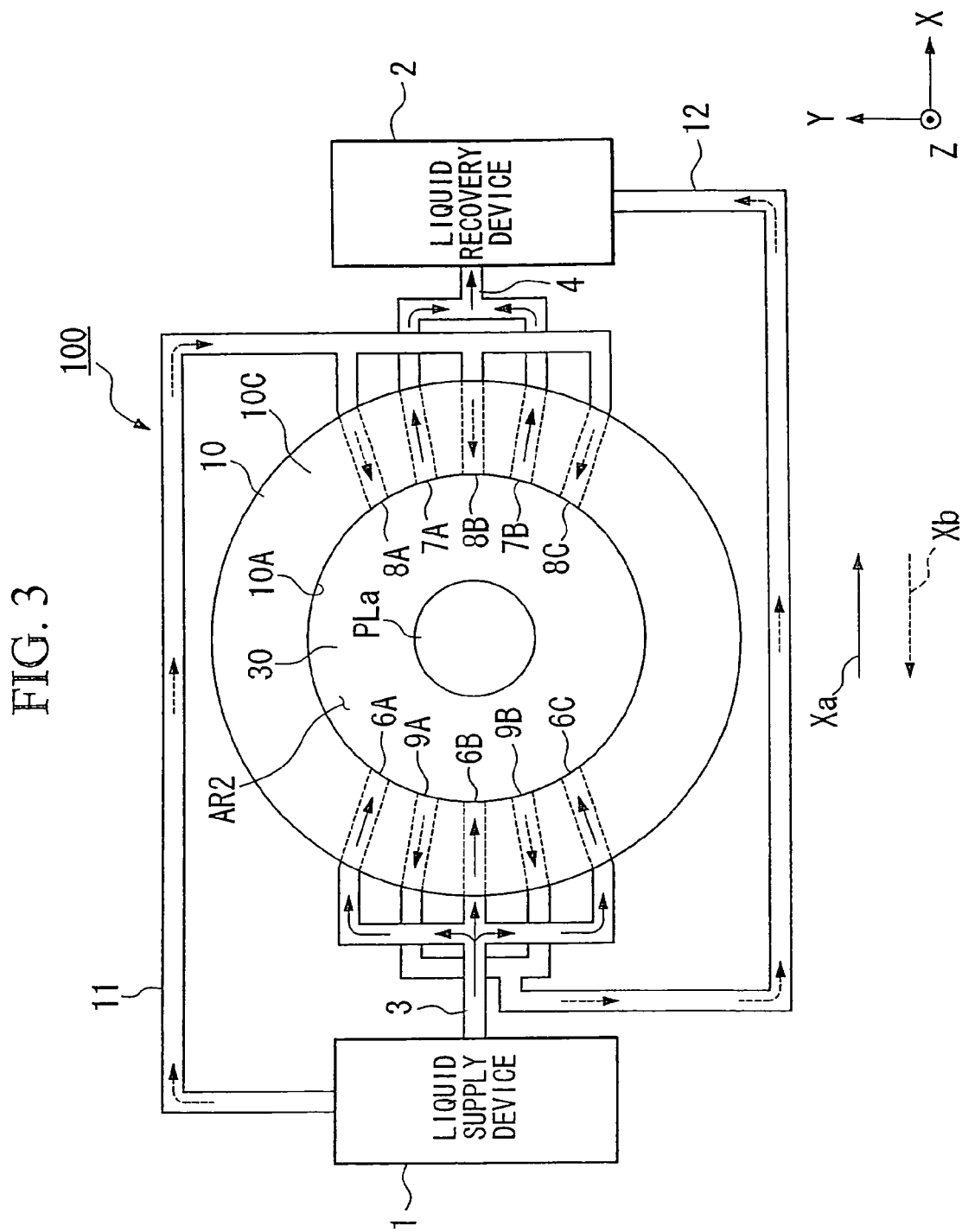
FIG. 3 is a plan view of the liquid immersion unit of FIG. 2 viewed from above.

FIG. 3 is a view of the liquid immersion unit 100 viewed from above. In FIG. 3, the upper end optical element PLa of the projection optical system PL is formed to be circular when viewed from the top, and the liquid bath 10 and its opening portion 10A are also formed to be circular when viewed from the top. And, the optical element PLa is located in substantially the center portion of the liquid bath 10 (the opening portion 10A). The supply pipe 3 connected to the liquid supply device 1 branches, halfway, into three flow paths, and each of the branch flow paths is respectively connected to either one of the three supply ports 6A-6C provided on the −X side of the optical element PLa of the projection optical system PL. On the other hand, on the +X side of the optical element PLa are provided two recovery ports 7A and 7B; and the flow paths, each connected to either one of those recovery ports 7A and 7B, are assembled into one, and the assembled flow path is connected to the recovery pipe 4. In other words, it is configured such that the supply ports 6A-6C connected to the liquid supply device 1 via the supply pipe 3 are provided on the −X side, and the recovery ports 7A and 7B connected to the liquid recovery device 2 via the recovery pipe 4 are provided on the +X side, in a manner in which the upper end portion of the optical element PLa of the projection optical system PL is interposed between the supply ports and the recovery ports.

Further, supply ports 8A-8C and recovery ports 9A and 9B are disposed in the arrangement in which the supply ports 6A-6C and the recovery ports 7A and 7B are rotated by substantially 180 degrees. The supply ports 8A-8C are connected to the liquid supply device 1 via the supply pipe 11, and the recovery ports 9A and 9B are connected to the liquid recovery device 2 via the recovery pipe 12. The supply ports 6A-6C and the recovery ports 9A and 9B are disposed alternately in the Y-direction, and the supply ports 8A-8C and the recovery ports 7A and 7B are disposed alternately in the Y-direction.

And, in the case of performing scanning exposure by moving the substrate P in the scanning direction (+X direction) indicated by arrow Xa, the supply and the recovery of the liquid 30 are performed by the liquid supply device 1 and the liquid recovery device 2, by the use of the supply pipe 3, the supply ports 6A-6C, the recovery pipe 4, and the recovery ports 7A and 7B. More specifically, when the substrate P moves in the +X direction, the liquid 30 is supplied from the liquid supply device 1 to the liquid bath 10 including the space between the projection optical system PL and substrate P via the supply pipe 3 and the supply ports 6A-6C, and, at the same time, the liquid 30 is recovered by the liquid recovery device 2 via the recovery ports 7A and 7B and the recovery pipe 4, with the liquid 30 flowing in the +X direction in liquid bath 10. On the other hand, in the case of performing scanning exposure by moving the substrate P in the scanning direction (−X direction) indicated by arrow Xb, the supply and the recovery of the liquid 30 are performed by the liquid supply device 1 and the liquid recovery device 2, by the use of the supply pipe 11, the supply ports 8A-8C, the recovery pipe 12, and the recovery ports 9A and 9B. More specifically, when the substrate P moves in the −X direction, the liquid 30 is supplied from the liquid supply device 1 to the liquid bath 10 including the space between the projection optical system PL and the substrate P via the supply pipe 11 and the supply ports 8A-8C, and, at the same time, the liquid 30 is recovered by the liquid recovery device 2 via the recovery ports 9A and 9B and the recovery pipe 12, with the liquid 30 flowing in the −X direction in the liquid bath 10.

In this way, the controller CONT, by using the liquid supply device 1 and the liquid recovery device 2, makes liquid 30 flow along the moving direction of the substrate P and in the same direction as the moving direction of the substrate P. Thus, fresh and clean liquid 30 can be continuously supplied to the space between the projection optical system PL and the substrate P. And, by changing, in response to the scanning direction, the direction in which liquid 30 is made to flow, the space between the projection optical system PL and the substrate P can be filled with the liquid 30, both in of the case where the substrate P is scanned in the +X direction and in the case where the substrate P is scanned in the −X direction, which makes it possible to obtain a high resolution and a wide depth of focus.

By the way, on the side wall portion 10C or the bottom portion 10D of the liquid bath 10 may be attached, for example, a focus detection system that can detect the surface position of the substrate P relative to the image plane of the projection optical system PL. In this case, the focus detection light passes through the liquid 30.

Next, an explanation will be made about a procedure for exposing the substrate P with the pattern of the mask M by using the exposure apparatus EX described above.

Here, the exposure apparatus EX of the present embodiment projection-exposes the pattern image of the mask M onto the substrate P while moving mask M and substrate P in the X-direction (scanning direction); and, during scanning exposure, a pattern image of a part of the mask M is projected onto the projection area AR1 formed above the projection optical system PL, and in synchronization with the movement of the mask M in the −X direction (or in the +X direction) at speed V, the substrate P moves, via the XY stage 53, in the +X direction (or in the −X direction) at speed β·V (β is the projection magnification). And, after completion of exposure for one shot area, a next shot area is brought to the projection area through the stepping movement of the substrate P, and in this way, exposure for each shot area is successively performed through the step-and-scan method.

First, after the mask M being loaded on the mask stage MST and at the same time the substrate P being loaded on the substrate stage PST, the controller CONT drives the liquid supply device 1 and the liquid recovery device 2 and starts the supply and recovery operations of the liquid 30 relative to the liquid bath 10. Liquid 30 delivered from the liquid supply device 1 to form the liquid immersion region AR2, after flowing through the supply pipe 3, is supplied to the liquid bath 10 via the supply ports 6A-6C. And, the controller CONT illuminates the mask M with the exposure light EL by means of the illumination optical system IL while synchronously moving the mask M and the substrate P and projects the pattern image of the mask M onto the substrate P via the projection optical system PL and the liquid 30.

While performing scanning exposure with the substrate P being moved in, e.g., the +X-direction, the liquid supply device 1 and the liquid recovery device 2 continue to perform the liquid supply operation and the liquid recovery operation. Since, by doing so, the temperature-adjusted liquid 30 is always supplied from the liquid supply device 1 to the liquid bath 10, excessive temperature change (temperature rise) of the liquid 30 in liquid bath 10 due to the irradiation heat of the exposure light can be suppressed, which realizes a high accuracy exposure of the pattern image.

With the liquid supply operation by the liquid supply device 1 and the liquid recovery operation by the liquid recovery device 2 being performed in a coordinated manner, the liquid 30 flows, between the substrate P and the optical element PLa of the projection optical system PL, in the direction parallel to (in the same direction as) the scanning direction of the substrate P. Further, when the liquid supply operation by the liquid supply device 1 and the liquid recovery operation by the liquid recovery device 2 are performed in a coordinated manner, the exposure surface of the substrate P and the surface of liquid 30 exposed upwardly from the aperture portion 10A of the liquid bath 10 come into contact with each other with the aid of the surface tension of liquid 30, and thus the liquid 30 is disposed between the projection area AR1 on the substrate P and the optical element PLa, forming the liquid immersion region AR2. Thus, the substrate P is exposed in the state in which the substrate P is held by the substrate stage PST such that the exposure surface of the substrate P comes into contact with the surface of liquid 30. In this configuration, since the exposure surface of the substrate P and the surface of liquid 30 are in contact with each other with the aid of the surface tension of liquid 30, a slight gap is formed between the exposure surface of the substrate P and the upper end surface of the liquid bath 10. Because of this, the substrate stage PST can freely move the substrate P in the XY-plane, with the substrate not being in contact with liquid bath 10.

By the way, when the scanning speed of the substrate P is changed, the controller CONT may change, depending on the scanning speed of the substrate P, the per-unit-time liquid supply amount of the liquid supply device 1 and the per-unit-time liquid recovery amount of the liquid recovery device 2. Specifically, when the moving speed of the substrate P is increased, the per-unit-time liquid supply amount and the per-unit-time liquid recovery amount are increased. By doing so, the flow rate of liquid 30 flowing between the projection optical system PL and the substrate P also increases in accordance with the moving speed of the substrate P, and thus the liquid immersion region AR2 can be smoothly formed between the projection optical system PL and the substrate P. In addition, it is preferable that the size of the liquid bath 10 (the aperture portion 10A) is determined in accordance with the moving speed of the substrate P. More specifically, when the moving speed of the substrate P is made to be higher, there arises the possibility that the liquid 30 in the liquid bath 10 is dragged by substrate P, the formation of the liquid immersion region AR2 becomes unstable, and the liquid 30 cannot be disposed on the projection area AR1 on the substrate P, though the liquid 30 can be, by making the liquid bath 10 larger to make the area of the contact surface between the substrate P and the liquid 30 larger, smoothly disposed on the projection area AR1, even if the moving speed of the substrate P is made to be higher.

Further, the distance between the liquid bath 10 and the substrate P held by substrate stage PST may be determined in accordance with the surface tension (interfacial tension) of the liquid 30 to be used. Purified water is used as liquid 30 in the embodiment; but, when another kind of liquid is used, since the surface tension values (interfacial tension values) of liquids vary depending on their material characteristics, the distance between the liquid bath 10 and the substrate P is set in accordance with the surface tension of the liquid used.

As described above, since the image plane of the projection optical system PL is formed above the projection optical system PL, and, at the same time, the substrate stage PST that is movable while holding the substrate P above the projection optical system PL is provided, the liquid bath 10 of the liquid immersion unit 100 can be provided on the upper end portion of the projection optical system PL that does not move, and the liquid immersion region AR2 can be formed between the projection optical system PL and the substrate P. Since the position of the liquid bath 10 is fixed, the undulation of the liquid surface exposed upwardly from the aperture portion 10A of the liquid bath 10 and the scattering of the liquid can be prevented, and the deterioration of the pattern image projected onto the substrate P can be suppressed. Further, since, with the liquid bath 10 being provided on the upper end portion of the projection optical system PL, the liquid supply device 1 for supplying liquid 30 to form the liquid immersion region AR2 and the supply pipe 3 connected thereto, and the liquid recovery device 2 for recovering liquid 30 and the recovery pipe 4 connected thereto need not be attached to the substrate stage PST which is a moving portion, the disadvantage, due to the device and the pipes, that the movement of the substrate stage PST is disturbed can be suppressed, for example.

It should be noted that although, in the embodiment, it is configured such that the temperature of liquid 30 supplied to the liquid bath 10 to form the liquid immersion region AR2 is adjusted by the temperature adjusting device provided to the liquid supply device 1, it may also be configured such that a temperature adjusting device of liquid 30 for forming the liquid immersion region AR2 is attached to the liquid bath 10.

It is to be noted that although, in the embodiment, it is configured such that during the scanning exposure, the liquid supply operation and the liquid recovery operation are continued to continuously make liquid 30 flow, the liquid immersion exposure can also be performed in the state that the liquid 30 is, without being made to flow, pooled in the liquid bath 10. However, with the supply and recovery of liquid 30 being performed, occurrence of temperature change (temperature rise) of liquid 30 in the liquid bath 10 due to the exposure light irradiation heat can be suppressed, and deterioration of the pattern can be prevented. Further, with the supply and recovery of liquid 30 being continuously performed during the exposure, clean liquid 30 can be always supplied from the liquid supply device 1 to the liquid bath 10, and, at the same time, even if impurities have come to be mixed in the liquid 30 of the liquid bath 10, the impurities can be immediately recovered from the liquid bath 10 by the liquid recovery device 2.

Figure 4:
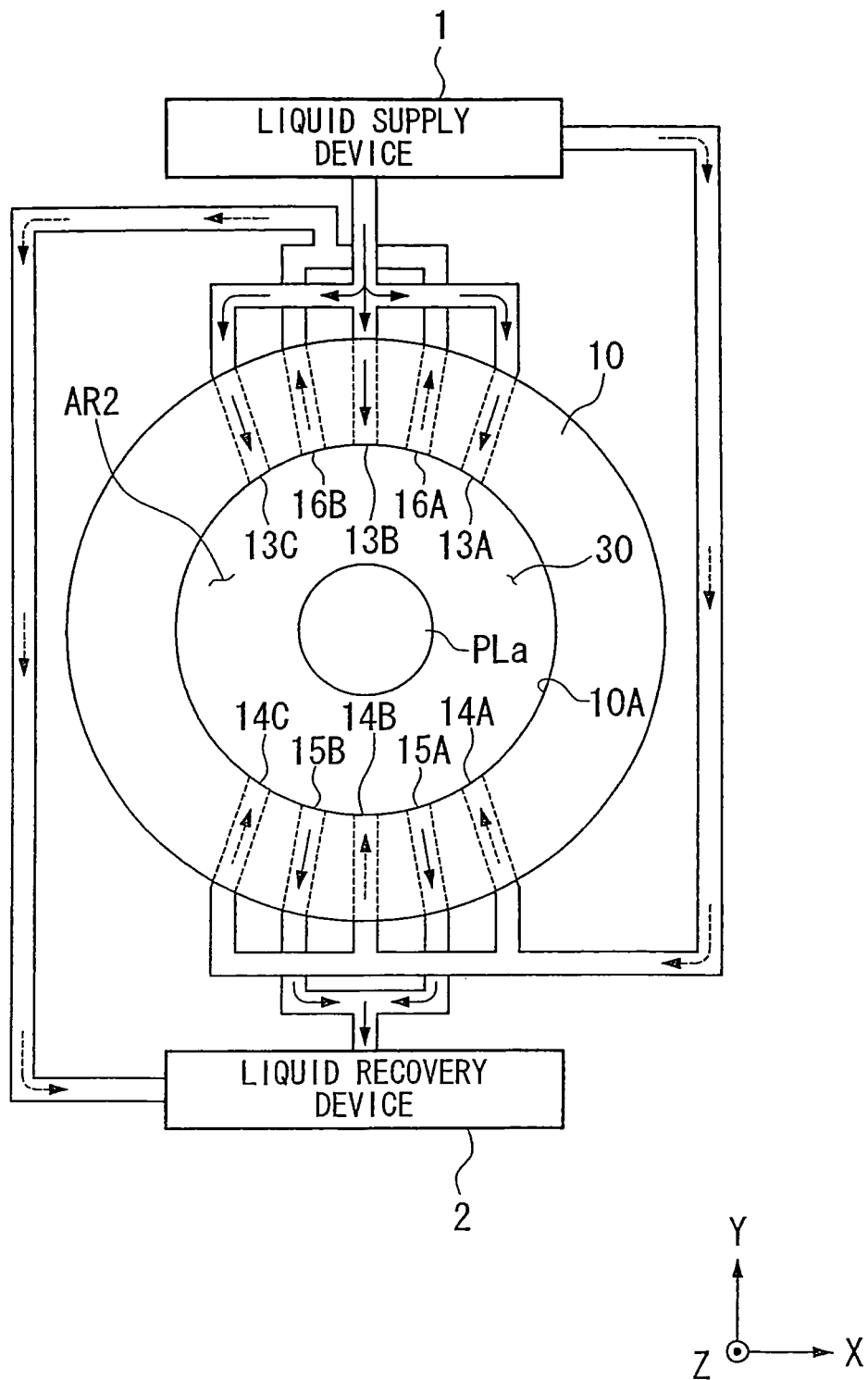
FIG. 4 is a plan view showing another liquid immersion unit embodiment.

It should be further noted that as shown in FIG. 4, on each of the Y-direction side portions between which the optical element PLa of the projection optical system PL is interposed may be provided supply nozzles 13A-13C, supply nozzles 14A-14C, recovery nozzles 15A, 15B, 16A, and 16B. By virtue of those supply nozzles and recovery nozzles, even when the substrate P moves in the non-scanning direction (the Y-axis direction) during its stepping movement, the liquid 30 can be stably supplied between the projection optical system PL and the substrate P. Still further, while, in the above-described embodiment, the liquid bath 10 is attached to the lens barrel in the vicinity of the upper end portion of the projection optical system PL, it may also be configured such that the bath is held by a supporting member separated from the projection optical system PL.

Figure 5:
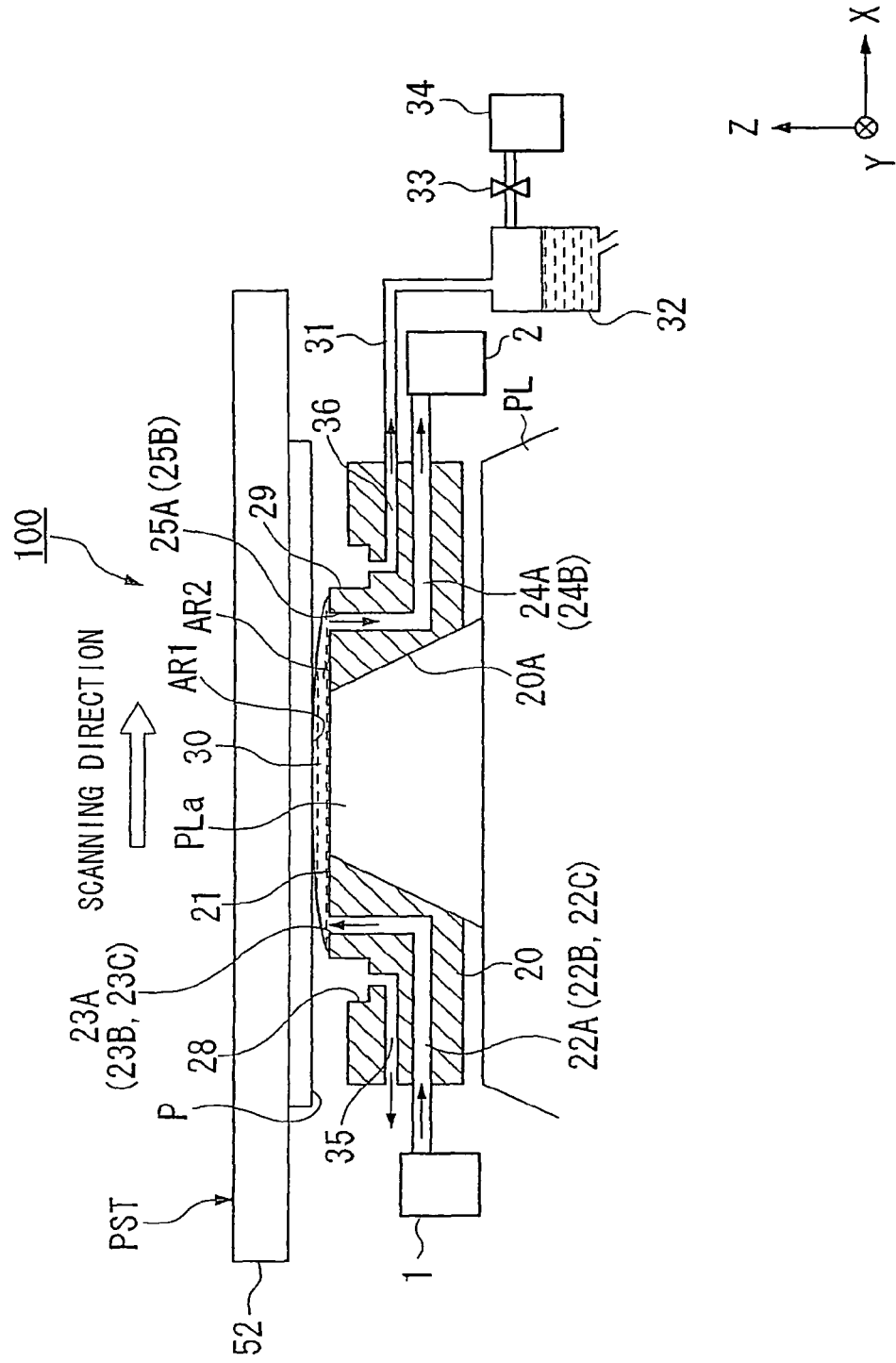
FIG. 5 is an enlarged main part drawing showing a second embodiment of an exposure apparatus of the present invention.
Figure 6:
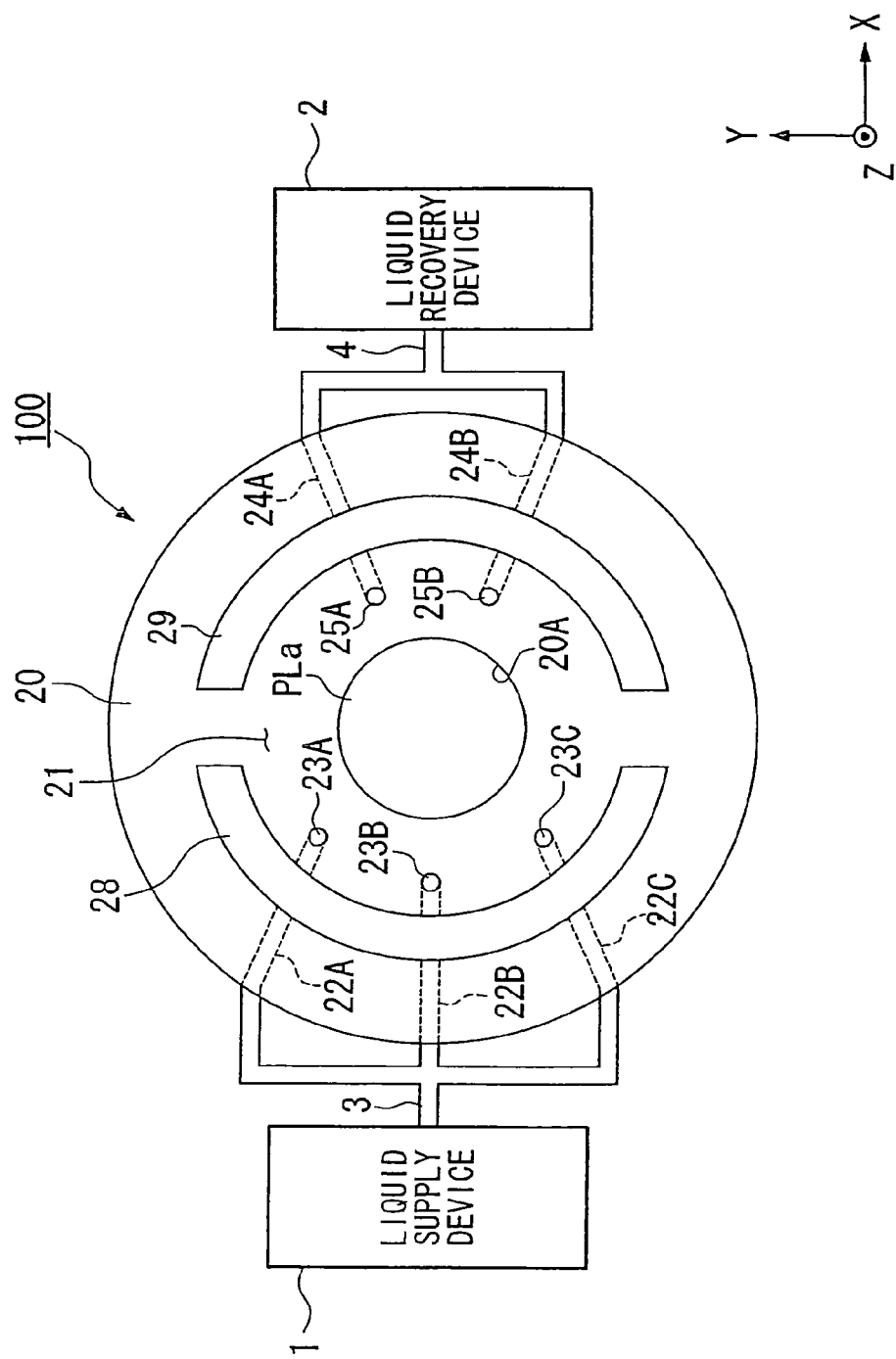
FIG. 6 is a plan view of the liquid immersion unit of FIG. 1 viewed from above.

Next, referring to FIGS. 5 and 6, a second embodiment exposure apparatus of the present invention will be described. FIG. 5 is a sectional side view of liquid immersion unit 100 of the second embodiment; FIG. 6 is a plan view thereof viewed from above. Here, in the following description, the same or equivalent constituent elements as those in the above-described embodiment are denoted by the same reference numerals, and their descriptions will be abridged or omitted.

In FIGS. 5 and 6, the liquid immersion unit 100 is provided with a liquid immersion forming member 20 that is attached to the upper end portion optical element PLa of the projection optical system PL and has an upper surface 21 facing the substrate P, with liquid supply ports 23A-23C that formed on the upper surface 21 and are connected to the liquid supply device 1 via flow paths 22A-22C formed inside the forming member 20 and supply pipe 3, and with liquid recovery ports 25A and 25B that formed on the upper surface 21 and are connected to the liquid recovery device 2 via flow paths 24A and 24B and recovery pipe 4. The forming member 20 has, in its center portion, as viewed from the top, a hole portion 20A that fits with the optical element PLa of the projection optical system PL, and it is configured such that when the optical element PLa is fitted with the hole portion 20A, the upper surface 21 of the forming member 20 and the upper end surface of the optical element PLa of the projection optical system PL are substantially flush with each other. Each of the liquid supply ports 23A-23C is provided on the –X side of the optical element PLa of the projection optical system PL and discharges the liquid 30 upwardly. On the other hand, the liquid recovery ports 25A and 25B are provided on the +X side of the optical element PLa and suck the liquid 30 downwardly. It should be noted that while, in this embodiment, three liquid supply ports and two liquid recovery ports are provided with, the number and arrangement thereof may be set in a discretionary way. Further, as well as the first embodiment, separate liquid supply ports and liquid recovery ports may be provided on the upper surface 21 in the arrangement in which the above-described liquid supply ports 23A-23C and liquid recovery ports 25A and 25B are rotated by substantially 180 degrees.

Outside of the liquid supply ports 23A-23C and the liquid recovery ports 25A and 25B on the upper surface 21 are provided trap portions 28 and 29 that recover liquid 30 that has not been recovered by the liquid recovery ports. Each of the trap portions 28 and 29 is an arc-shaped groove, as viewed from the top, and is provided in the position such that the optical element PLa of the projection optical system PL is interposed between the trap portions.

In FIG. 5, a flow path 36 connected to the trap portion 29 is connected to a tank 32 and to a vacuum pump 34 as a suction device, via a conduit 31 provided outside the forming member 20. The flow path that connects the tank 32 with the vacuum pump 34 is provided with a valve 33. The tank 32 is provided with a discharge flow path 32A, and it is configured such that when the liquid 30 has pooled in the tank up to a predetermined amount, the liquid is discharged through the discharge flow path 32A. It should be noted that although not shown, a flow path 35 connected to the trap portion 28 is also connected to a tank, a valve, and a vacuum pump, similar to the above-described ones.

When the substrate P is scan-exposed while moving the substrate in the +X direction, the controller CONT drives the liquid supply device 1 and the liquid recovery device 2, supplies the liquid 30 to the upper surface 21 via the liquid supply ports 23A-23C, and forms the liquid immersion region AR2 between the optical element PLa of the projection optical system PL and the substrate P. And, the liquid 30 is recovered via the liquid recovery ports 25A and 25B, and the substrate P is exposed, with liquid 30 being made to flow in the direction parallel to (in the same direction as) the scanning direction of the substrate P. In this case, the liquid 30 supplied from, e.g., the liquid supply device 1 via supply ports 23A-23C flows in the manner that the liquid, being induced by the +X direction movement of the substrate P, is pulled into the space between the projection optical system PL and the substrate P, and thus, even if the supply energy of the liquid supply device 1 is small, the temperature-adjusted liquid 30 is always supplied from the liquid supply device 1 between the upper end surface of the optical element PLa and the substrate P, and excessive temperature change (temperature rise) of the liquid 30 due to the irradiation heat of the exposure light is suppressed, which realizes a high accuracy exposure of the pattern image.

The liquid bath having the side wall is used to hold the liquid 30 in the first embodiment; in contrast, it is configured in the second embodiment such that the liquid 30 is disposed between the planar upper surface 21 and the upper end surface of the optical element PLa, and the substrate P, and thus, even when the substrate P is inclined by a large amount, the substrate P does not come into contact with the forming member 20. And, since, also in this embodiment, it is configured such that the substrate P is moved in the state that the liquid immersion forming member 20 of the liquid immersion unit 100 is fixed to the projection optical system PL that does not move, undulation, scattering, etc. of the liquid 30 do not occur, which realizes stable projection of the pattern image onto the substrate P.

Figure 7:
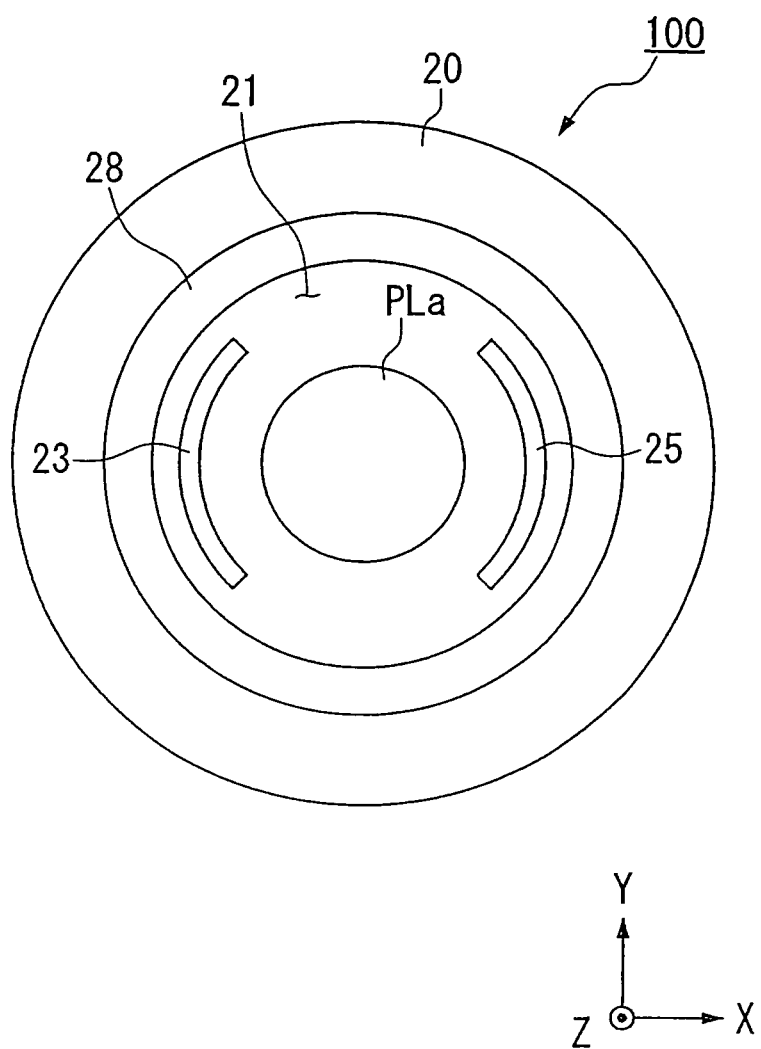
FIG. 7 is a plan view showing another liquid immersion unit embodiment.

It should be noted that while, in the embodiment, it is configured such that the supply and recovery operations of the liquid 30 are performed through the multiple liquid supply ports and liquid recovery ports provided in the predetermined positions on the upper surface 21, it may also be configured such that by combining the multiple liquid supply ports and liquid recovery ports respectively, for example, as shown in FIG. 7, a liquid supply hole 23 and a liquid recovery hole 25, each long hole-shaped (arc-shaped) as viewed from the top, are provided. Further, as shown in FIG. 7, the trap portion 28 may be formed annularly so as to surround the optical element PLa of the projection optical system PL. Still further, it may be configured such that, without providing the liquid recovery ports 25A and 25B, all of the supplied liquid 30 is recovered by the trap portions 28 and 29.

It is to be noted that in the embodiment, the trap portions for recovering the liquid 30 that has not been recovered by the liquid recovery ports are constituted by the grooves and the vacuum pumps (suction devices) connected thereto, but, by, for example, disposing porous members, such as sponges, in the grooves, the liquid 30 that has not been recovered can be recovered and held by the porous members.

As described above, the liquid 30 of the embodiments is constituted by purified water. Purified water has the advantage that it can be easily available in large quantities in, e.g., a semiconductor manufacturing factories and also the advantage that it does not adversely affect photoresist on the substrate P, the optical elements (lenses), etc. Further, purified water does not adversely affect the environment and contains scarcely any impurities. Thus, the effect that it cleans the surface of the substrate P and the surface of the optical element provided at the end portion of the projection optical system PL can be expected. And, the refractive index n of purified water (water) relative to the exposure light EL having a wavelength of about 193 nm is approximately 1.44, and when ArF excimer laser light (having 193 nm wavelength) is used as the light source of exposure light EL, the wavelength is effectively shortened, on the substrate P, as multiplied by 1/n, i.e., effectively becomes approximately 134 nm, and thus, a high resolution can be obtained. Furthermore, because the depth of focus will increase approximately n times, i.e., approximately 1.44 times, that of in air, the numerical aperture of the projection optical system PL can be further increased if it is preferable to ensure a depth of focus approximately the same as that when used in air, and the resolution is also improved from this standpoint.

It should be noted that if the pressure, caused by the flow of the liquid 30, of the space between the optical element located at the end of the projection optical system PL and the substrate P is high, it may be configured such that the optical element is rigidly fixed so as not to move due to the pressure, instead of making the optical element exchangeable.

It should be noted that while, in the embodiments, the liquid 30 is water, the liquid 30 may be a liquid other than water. For example, when the light source of the exposure light EL is an $F_2$ laser, the $F_2$ laser light does not transmit through water, and thus, as the liquid 30, a fluorofluid that can transmit the $F_2$ laser light may be used. Further, as the liquid 30, a material (e.g., cedar oil) that can transmit the exposure light EL, has a high refractive index as high as practicable, and does not affect the projection optical system and the photoresist applied to the surface of the substrate P can also be used.

It is to noted that the substrate P of each of the above-described embodiments, can be not only a semiconductor wafer for manufacturing a semiconductor device, but also a glass substrate for a display device, a ceramic wafer for a thin film magnetic head, a master mask or reticle (synthetic quartz or silicon wafer), etc.

As the exposure apparatus EX, in addition to a scan type exposure apparatus (scanning stepper) in which while synchronously moving the mask M and the substrate P, the pattern of the mask M is scan-exposed, a step-and-repeat type projection exposure apparatus (stepper) that exposes the full pattern of the mask M in the state in which the mask M and substrate P are stationary, and the substrate P is successively moved stepwise can be used. Also, the present invention can be applied to a step-and-stitch type exposure apparatus in which at least two patterns are transferred onto the substrate P in a partially overlapping manner.

Also, the present invention can be applied to a twin stage type exposure apparatus, which is disclosed in, e.g., Japanese Unexamined Patent Application, First Publication Nos. H10-163099 and H10-214783, and Published Japanese Translation No. 2000-505958 of the PCT International Publication.

The type of exposure apparatus EX, the present invention is not limited to an exposure apparatus, which exposes a semiconductor pattern onto the substrate P, for manufacturing semiconductor devices, but can also be applied to a variety of exposure apparatuses, e.g., an exposure apparatus for manufacturing liquid crystal display devices or a displays, an exposure apparatus for manufacturing thin film magnetic heads, an exposure apparatus for manufacturing image pickup devices, and an exposure apparatus for manufacturing reticles or masks.

When using a linear motor (see U.S. Pat. Nos. 5,623,853 or 5,528,118) in substrate stage PST or mask stage MST, either air-cushion type linear motor using an air bearing or a magnetic levitation type linear motor using a Lorentz force or reactance force may be used. Further, each of substrate stage PST and mask stage MST may be either of a type moving along a guide or of a guideless type having no guide.

For the driving mechanism for each of the substrate stage PST and the mask stage MST, a planar motor may be used that opposes a magnet unit in which magnets are two-dimensionally arranged to an armature unit in which coils are two-dimensionally arranged, and that drives each of the substrate stage PST and the mask stage MST by an electromagnetic force. In this case, either one of the magnet unit and the armature unit is attached to the stage PST or the stage MST, and the other unit is attached to the moving surface side of the stage PST or the stage MST.

A reaction force generated by the movement of the substrate stage PST may be, as described in Japanese Unexamined Patent Application, First Publication No. H08-166475 (U.S. Pat. No. 5,528,118), mechanically released to the floor (earth) by use of a frame member so that the force does not transmit to the projection optical system PL.

A reaction force generated by the movement of the mask stage MST may be, as described in Japanese Unexamined Patent Application, First Publication No. H08-330224 (U.S. patent application Ser. No. 08/416,558), mechanically released to the floor (earth) by use of a frame member so that the force does not transmit to the projection optical system PL.

As described above, the exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which the temperature, purity, etc. are controlled.

As shown in FIG. 8, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; step 204 in which the mask pattern is exposed onto the substrate by the exposure apparatus EX according to the above-described embodiments; device assembly step 205 (including the dicing process, bonding process, and packaging process); inspection step 206.

In accordance with the present invention, since scattering of a liquid for forming a liquid immersion region can be suppressed, and, at the same time, the movement of a substrate stage is not obstructed by pipings and the like for supplying and recovering the liquid, required patterns can be exposed onto the substrate with high accuracy.

What is claimed is:

1. An immersion exposure apparatus comprising:
an optical member;
a liquid immersion unit that fills a space between an upper surface of the optical member and at least a portion of a movable object with a liquid, wherein
the liquid immersion unit has a liquid holding member arranged around the optical member and a supply outlet provided at the liquid holding member, and the liquid holding member has a hole into which at least a portion of the optical member is disposed.

2. The immersion exposure apparatus according to claim 1, wherein the liquid holding member includes a liquid immersion forming member having an upper surface, a space between the upper surface of the liquid immersion forming member and the object also being filled with the liquid.

3. The immersion exposure apparatus according to claim 2, wherein the liquid is retained between the upper surface of the liquid immersion forming member and the object, and between the upper surface of the optical member and the object.

4. The immersion exposure apparatus according to claim 2, wherein the upper surface of the optical member is planar.

5. The immersion exposure apparatus according to claim 4, wherein the upper surface of the liquid immersion forming member and the upper surface of the optical member are flush with each other.

6. The immersion exposure apparatus according to claim 2, wherein the supply outlet is provided on the liquid immersion forming member.

7. The immersion exposure apparatus according to claim 6, wherein the supply outlet is provided on the upper surface of the liquid immersion forming member.

8. The immersion exposure apparatus according to claim 2, wherein the liquid immersion unit has a recovery inlet that recovers the liquid, and the liquid immersion forming member has the recovery inlet.

9. The immersion exposure apparatus according to claim 8, wherein the recovery inlet is provided on the upper surface of the liquid immersion forming member.

10. The immersion exposure apparatus according to claim 9, wherein the supply outlet is provided on the upper surface of the liquid immersion forming member.

11. The immersion exposure apparatus according to claim 2, wherein the liquid immersion forming member has a first recovery portion.

12. The immersion exposure apparatus according to claim 11, wherein the first recovery portion has a first suction inlet and a porous member.

13. The immersion exposure apparatus according to claim 11, wherein the liquid immersion forming member has a second recovery portion provided outside of the first recovery portion relative to a path through which an exposure beam passes.

14. The immersion exposure apparatus according to claim 13, wherein the second recovery portion has a second suction inlet and a porous member.

15. The immersion exposure apparatus according to claim 1, wherein the liquid holding member has a liquid containment member configured to surround the liquid, the liquid contacting the upper surface of the optical member.

16. The immersion exposure apparatus according to claim 15, wherein the liquid containment member has an opening portion via which the liquid contacts with the object.

17. The immersion exposure apparatus according to claim 16, wherein the object and the liquid make contact with each other with the aid of surface tension of the liquid.

18. The immersion exposure apparatus according to claim 16, wherein the supply outlet is provided on the liquid containment member.

19. The immersion exposure apparatus according to claim 15, wherein
the liquid containment member has a side surface that contacts with the liquid, and
the supply outlet is provided on the side surface of the liquid containment member.

20. The immersion exposure apparatus according to claim 18, wherein the liquid immersion unit has a recovery portion that recovers the liquid, and the recovery portion is provided in the liquid containment member.

21. The immersion exposure apparatus according to claim 20, wherein
the liquid containment member has a side surface that makes contact with the liquid, and
the recovery portion has a suction inlet provided on the side surface of the liquid containment member.

22. The immersion exposure apparatus according to claim 15, wherein the liquid immersion unit has a recovery portion that recovers the liquid, and the recovery portion is provided in the liquid containment member.

23. The immersion exposure apparatus according to claim 22, wherein the recovery portion has a suction inlet.

24. The immersion exposure apparatus according to claim 23, wherein
the liquid containment member has a side surface that makes contact with the liquid, and
the suction inlet is provided on the side surface of the liquid containment member.

25. The immersion exposure apparatus according to claim 15, wherein a sealing member is disposed between the liquid containment member and the optical member.

26. The immersion exposure apparatus according to claim 15, wherein
the liquid containment member has an upper end portion, and
a distance between the object and the upper end portion of the liquid containment member is shorter than that between the object and the upper surface of the optical member.

27. The immersion exposure apparatus according to claim 15, wherein the liquid containment member is a liquid bath.

28. An immersion exposure method comprising:
filling a space between an upper surface of an optical member and at least a portion of a substrate with a liquid by use of a liquid immersion unit which has a liquid holding member arranged around the optical member and a supply outlet provided at the liquid holding member and which is disposed below a movable object, the liquid holding member having a hole into which at least a portion of the optical member is disposed; and
exposing the substrate in a state such that at least the space between the upper surface of the optical member and the substrate is filled with the liquid.

29. The immersion exposure method according to claim 28, wherein
the liquid holding member includes a liquid immersion forming member having an upper surface, and
the liquid is retained between an upper surface of the liquid immersion forming member and the substrate, and between the upper surface of the optical member and the substrate.

30. The immersion exposure method according to claim 29, wherein the liquid is discharged upwardly via a supply outlet of the liquid immersion forming member.

31. The immersion exposure method according to claim 29, wherein the liquid is recovered downwardly via a recovery inlet of the liquid immersion forming member.

32. The immersion exposure method according to claim 28, wherein the liquid is pooled in a liquid containment member having an opening portion via which the substrate and the liquid make contact with each other.

33. The immersion exposure method according to claim 28, wherein the liquid and the substrate make contact with each other with the aid of surface tension of the liquid.

34. A manufacturing method of an immersion exposure apparatus, the manufacturing method comprising:
providing an optical member; and
providing a liquid immersion unit that fills a space between an upper surface of the optical member and at least a portion of a movable object with a liquid, wherein
the liquid immersion unit has a liquid holding member arranged around the optical member and a supply outlet provided at the liquid holding member, and the liquid holding member has a hole into which at least a portion of the optical member is disposed.

35. An exposure apparatus that exposes a substrate via an optical system and a liquid, the exposure apparatus comprising:
substrate holding means for holding the substrate above the optical system; and
liquid immersion means for filling a space between the optical system and at least a portion of the substrate with the liquid while the substrate is exposed via the optical system and the liquid, the liquid immersion means being disposed below the substrate and including a liquid holding member arranged around the optical system and a supply outlet provided at the liquid holding member, the liquid holding member having a hole into which at least a portion of the optical system is disposed.

36. An immersion exposure apparatus comprising:
an optical member; and
means for filling a space between an upper surface of the optical member and at least a portion of a movable object of exposure with a liquid, the means being disposed below the movable object and including a liquid holding member arranged around the optical member and a supply outlet provided at the liquid holding member, the liquid holding member having a hole into which at least a portion of the optical member is disposed.

37. A device manufacturing method that uses an exposure apparatus according to claim 1.

38. A device manufacturing method that uses an exposure method according to claim 28.

39. The immersion exposure method according to claim 29, wherein
the upper surface of the optical member is planar,
the liquid is retained in a state such that the upper surface of the liquid immersion forming member and the upper surface of the optical member are flush with each other.

40. The immersion exposure method according to claim 29, wherein the liquid is supplied via a supply outlet comprised by the liquid immersion forming member.

41. The immersion exposure method according to claim 29, wherein the liquid is recovered via a recovery inlet comprised by the liquid immersion forming member.

42. The immersion exposure method according to claim 29, wherein the liquid is recovered by a first recovery portion comprised by the liquid immersion forming member.

43. The immersion exposure method according to claim 42, wherein the liquid is recovered via a first suction inlet comprised by the first recovery portion and via a porous member.

44. The immersion exposure method according to claim 42, wherein the liquid is recovered via a second recovery portion provided outside of the first recovery portion with respect to an optical axis of the optical member.

45. The immersion exposure method according to claim 44, wherein the liquid is recovered via a second suction inlet comprised by the second recovery portion and via a porous member.

46. The immersion exposure method according to claim 32, wherein the liquid contacts with the substrate via an opening portion comprised by the liquid containment member.

47. The immersion exposure method according to claim 32, wherein the liquid is supplied to the liquid containment member.

48. The immersion exposure method according to claim 47, wherein the liquid is supplied to the containment member via a supply outlet provided on a side surface of the liquid containment member.

49. The immersion exposure method according to claim 32, wherein the liquid is recovered from the liquid containment member.

50. The immersion exposure method according to claim 49, wherein the liquid is recovered via a suction inlet provided on a side surface of the liquid containment member.

* * * * *